(12) United States Patent
Song et al.

(10) Patent No.: US 11,521,866 B2
(45) Date of Patent: Dec. 6, 2022

(54) PLASMA PROCESSING METHOD, PLASMA PROCESSING APPARATUS AND METHOD OF MANUFACTURING SEMICONDUCTOR DEVICE USING THE APPARATUS

(71) Applicant: Samsung Electronics Co., Ltd., Suwon-si (KR)

(72) Inventors: Seung-Yoon Song, Seoul (KR); Chan-Hoon Park, Osan-si (KR); Jong-Woo Sun, Hwaseong-si (KR); Jung-Mo Sung, Seoul (KR); Je-Woo Han, Hwaseong-si (KR); Jin-Young Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/198,938

(22) Filed: Mar. 11, 2021

(65) Prior Publication Data

US 2021/0202276 A1 Jul. 1, 2021

Related U.S. Application Data

(63) Continuation of application No. 16/509,815, filed on Jul. 12, 2019, now Pat. No. 11,037,806.

(30) Foreign Application Priority Data

Jan. 10, 2019 (KR) .......................... 10-2019-0003085

(51) Int. Cl.
*H01L 21/67* (2006.01)
*H01J 37/32* (2006.01)
(Continued)

(52) U.S. Cl.
CPC .... *H01L 21/67069* (2013.01); *H01J 37/3211* (2013.01); *H01J 37/32568* (2013.01);
(Continued)

(58) Field of Classification Search
CPC ......... H01L 21/67069; H01L 21/67253; H01L 21/3065; H01L 21/3083; H01L 21/76224;
(Continued)

(56) References Cited

U.S. PATENT DOCUMENTS 6,129,806 A   10/2000 Kaji et al.
6,201,208 B1   3/2001 Wendt et al.
(Continued)

FOREIGN PATENT DOCUMENTS

KR   10-1098794 B1   12/2011
KR   10-1108575 B1   1/2012
KR   10-2018-0012060 A   2/2018

OTHER PUBLICATIONS

"Ratio" Definition via https://www.google.com/search?q=ratio+definition&rlz=1C1GCEA_enUS794US794&oq=rati&aqs=chrome.0.69i59j69i57j0i433i51212j0i131i433i512j0i433i51214j0i512.824j0j1 &sourceid=chrome&ie=UTF-8 ; p. 1; (Year: 2022).*

*Primary Examiner* — Binh X Tran
(74) *Attorney, Agent, or Firm* — Muir Patent Law, PLLC

(57) ABSTRACT

In a plasma processing method, a substrate is loaded onto a lower electrode within a chamber. A plasma power is applied to form plasma within the chamber. A voltage function of a nonsinusoidal wave having a DC pulse portion and a ramp portion is generated. Generating the voltage function may include setting a slope of the ramp portion and setting a duration ratio of the ramp portion to a cycle of the voltage function in order to control an ion energy distribution generated at a surface of the substrate. A bias power of the nonsinusoidal wave is applied to the lower electrode.

20 Claims, 13 Drawing Sheets

(51) Int. Cl.
    *H01L 21/762* (2006.01)
    *H01L 21/308* (2006.01)
    *H01L 21/3065* (2006.01)

(52) U.S. Cl.
    CPC  *H01L 21/67253* (2013.01); *H01J 2237/3343* (2013.01); *H01L 21/3065* (2013.01); *H01L 21/3083* (2013.01); *H01L 21/76224* (2013.01)

(58) Field of Classification Search
    CPC ............ H01J 37/3211; H01J 37/32568; H01J 2237/3343; H01J 2237/2343
    See application file for complete search history.

(56) References Cited

U.S. PATENT DOCUMENTS

| | | |
|---|---|---|
| 9,685,297 B2 | 6/2017 | Carter et al. |
| 10,410,874 B2 | 9/2019 | Yoo et al. |
| 10,516,388 B1 | 12/2019 | Kim et al. |
| 2002/0125207 A1 | 9/2002 | Ono et al. |
| 2008/0190893 A1 | 8/2008 | Mori et al. |
| 2008/0289576 A1 | 11/2008 | Lee et al. |
| 2012/0318456 A1* | 12/2012 | Brouk ............... H01J 37/32935 315/111.21 |
| 2014/0302678 A1 | 10/2014 | Paterson et al. |
| 2016/0079037 A1* | 3/2016 | Hirano .............. H01J 37/32183 156/345.28 |
| 2018/0182600 A1 | 6/2018 | Sohn et al. |
| 2018/0226225 A1* | 8/2018 | Koh ................. H01L 21/67069 |
| 2019/0157040 A1* | 5/2019 | Fairbairn ................ C23C 16/52 |
| 2020/0168437 A1* | 5/2020 | Ziemba ............. H01J 37/32706 |

* cited by examiner

PLASMA PROCESSING METHOD, PLASMA PROCESSING APPARATUS AND METHOD OF MANUFACTURING SEMICONDUCTOR DEVICE USING THE APPARATUS

PRIORITY STATEMENT

This application is a continuation application of U.S. patent application Ser. No. 16/509,815, filed Jul. 12, 2019, which claims priority under 35 U.S.C. § 119 to Korean Patent Application No. 10-2019-0003085, filed on Jan. 10, 2019 in the Korean Intellectual Property Office (KIPO), the contents of each of which are herein incorporated by reference in their entirety.

BACKGROUND

1. Field

Example embodiments relate to a plasma processing method and plasma processing apparatus. For example, example embodiments relate to a plasma processing method of etching an object layer on a substrate using plasma and a plasma processing apparatus for performing the same. The disclosure is also related to a method of manufacturing a semiconductor device using the plasma processing apparatus and/or the plasma processing method.

2. Description of the Related Art

Various types of semiconductor devices are manufactured using plasma-based etching techniques. For example, a plasma etching apparatus such as an inductively coupled plasma etching apparatus may generate plasma within a chamber to perform an etch process. However, as patterns of semiconductor devices get smaller, uniformity control of the patterns gets harder. In order to improve etch uniformity between fine recess patterns in a cell region, a more precise plasma control may be beneficial.

SUMMARY

Example embodiments provide a plasma processing method capable of improving etch performance.

Example embodiments provide a plasma processing apparatus for performing the plasma processing method.

According to example embodiments, in a plasma processing method, a substrate is loaded onto a lower electrode within a chamber. A plasma power is applied to form plasma within the chamber. A voltage function of a nonsinusoidal wave having a DC pulse portion and a ramp portion is generated. Generating the voltage function includes setting a slope of the ramp portion and setting a duration ratio of the ramp portion to a cycle of the voltage function, in order to control an ion energy distribution generated at a surface of the substrate. A bias power of the nonsinusoidal wave is applied to the lower electrode.

According to example embodiments, in a plasma processing method, a semiconductor substrate is loaded onto a lower electrode within a chamber, the semiconductor substrate including a photoresist pattern having openings. A plasma power is applied to form plasma within the chamber. A voltage function of a nonsinusoidal wave having a DC pulse portion and a ramp portion is generated. Generating the voltage function includes setting a slope of the ramp portion and setting a duration ratio of the ramp portion to a cycle of the voltage function to reduce an etch difference between different openings to be formed on the semiconductor substrate. A bias power of the nonsinusoidal wave is applied to the lower electrode.

According to example embodiments, a plasma processing apparatus includes a chamber, a substrate stage configured to support a substrate within the chamber, the substrate stage including a lower electrode, an upper electrode disposed over the lower electrode to face the substrate, a plasma power supply configured to apply a plasma power to the upper electrode to form plasma within the chamber, a bias power supply configured to apply a bias power of a nonsinusoidal wave having a DC pulse portion and a ramp portion to the lower electrode in response to a bias control signal, and a controller configured to determine a slope of the ramp portion and a duration ratio of the ramp portion to the nonsinusoidal wave such that an ion energy distribution is generated at a surface of the substrate and to output the bias control signal to the bias power supply corresponding to the bias power of the determined nonsinusoidal wave.

According to example embodiments, in a plasma processing method and in a plasma processing apparatus, a bias power of a nonsinusoidal wave having a DC pulse portion and a ramp portion may be applied to a lower electrode. A slope of the ramp portion and a duration ratio of the ramp portion to the nonsinusoidal wave may be adjusted to obtain a desired/proper ion energy distribution at a surface of a substrate and to minimize IC loading. Additionally, an on/off duty ratio of the nonsinusoidal wave may be adjusted to improve the IC loading.

Accordingly, the voltage function of the nonsinusoidal wave may be adjusted to obtain desired/proper process conditions, to thereby improve etch performance such as etch rate, etch selectivity, IC loading, ion flux, UPEH (Unit Per Equipment Hour), etc.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

FIG. 1 is a block diagram illustrating a plasma processing apparatus in accordance with example embodiments.

FIG. 2 is a view illustrating plasma generated within a chamber of the plasma processing apparatus in FIG. 1.

FIG. 3 is a waveform diagram illustrating a sinusoidal wave power signal generated by a plasma power supply of the plasma processing apparatus in FIG. 1.

FIG. 4 is a block diagram illustrating a bias power supply of the plasma processing apparatus in FIG. 1.

FIG. 5 is a waveform diagram illustrating a nonsinusoidal wave power signal generated by the bias power supply of the plasma processing apparatus in FIG. 1.

FIG. 6 is a flow chart illustrating a plasma processing method in accordance with example embodiments.

FIG. 7 is a flow chart illustrating a step of applying a bias power having a nonsinusoidal voltage waveform in accordance with example embodiments.

FIG. 9 is graphs illustrating an ion energy distribution according to the slope of the ramp portion.

FIG. 10 is a graph illustrating IC loading according to a voltage value of the ramp portion.

FIG. 11 is graphs illustrating a duration ratio of the ramp portion in accordance with example embodiments.

FIG. 12 is a graph illustrating an etch rate difference (IC loading) according to the duration ratio of the ramp portion in FIG. 11.

FIG. 13 is a graph illustrating an on/off duty ratio of the nonsinusoidal voltage waveform.

FIG. 14 is a cross-sectional view illustrating a method of forming a pattern of a semiconductor device in accordance with example embodiments.

DETAILED DESCRIPTION OF EXAMPLE EMBODIMENTS

Hereinafter, example embodiments will be explained in detail with reference to the accompanying drawings.

Figure 1:
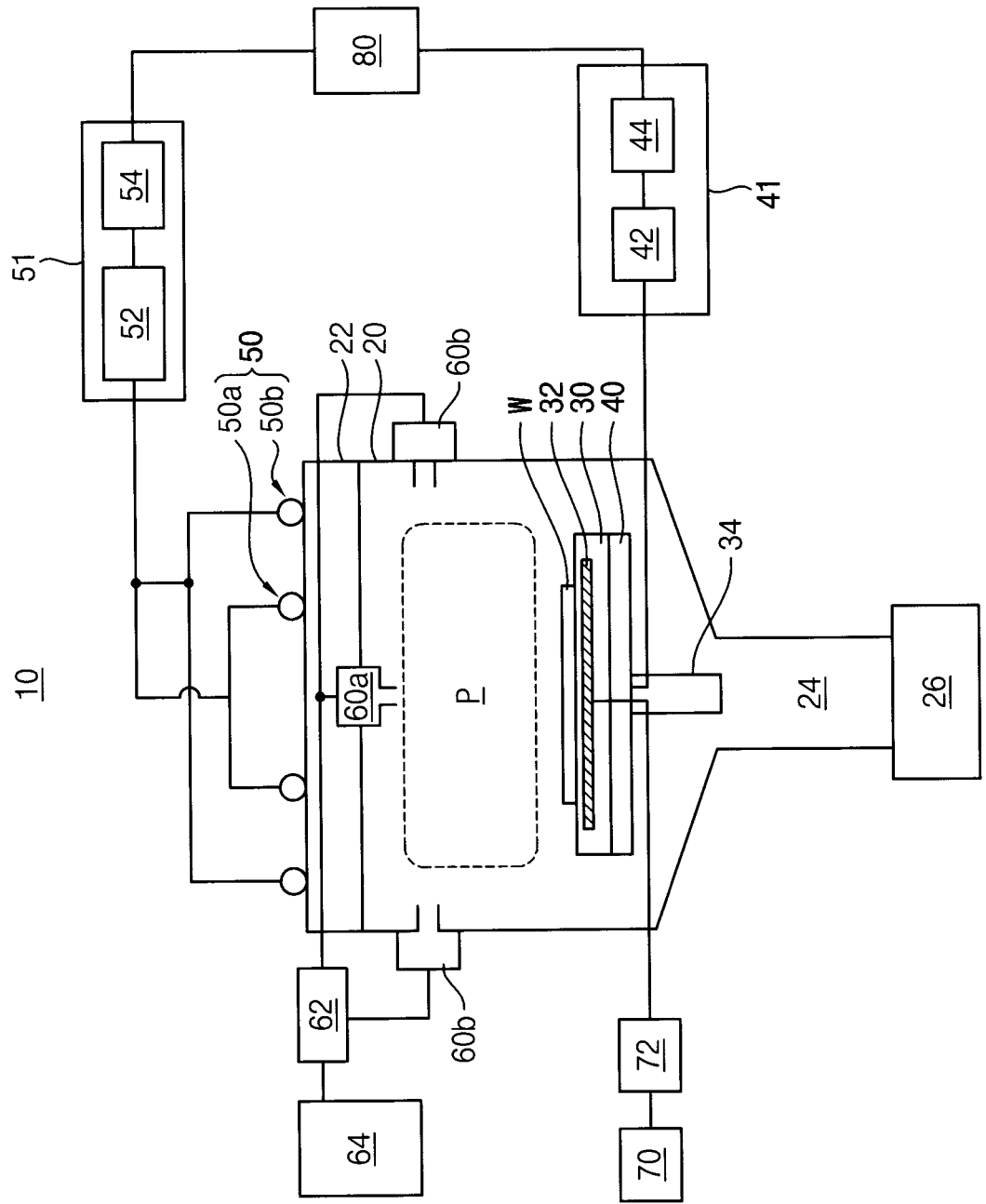
Figure 2:
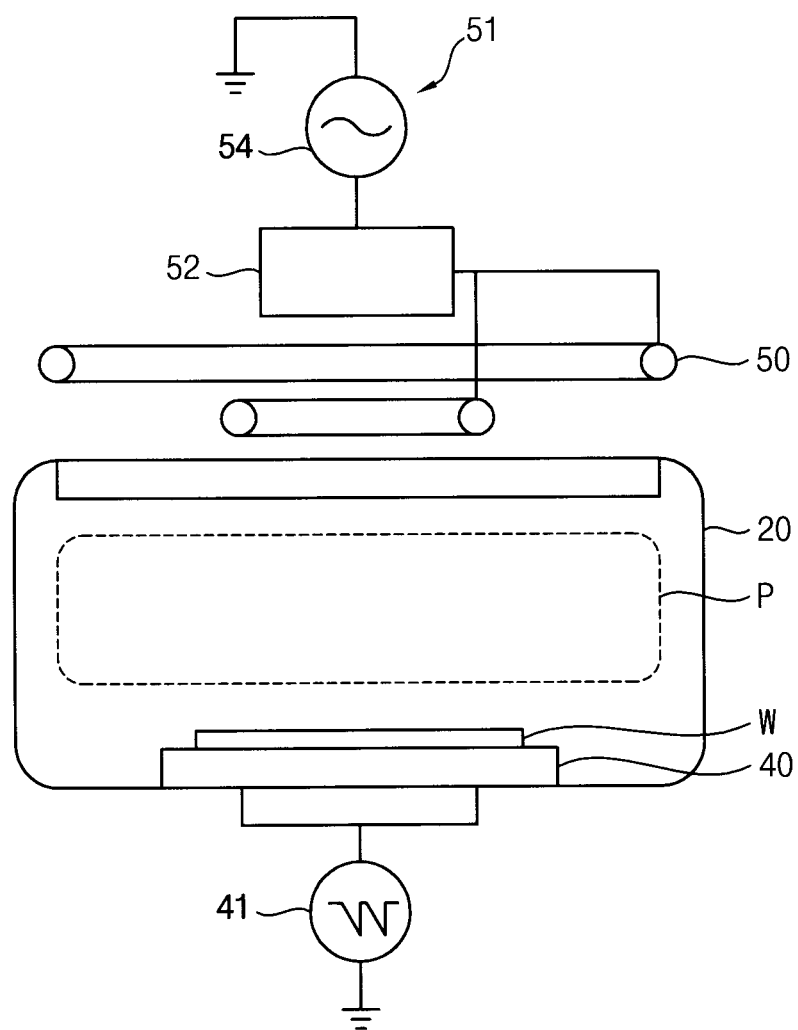
Figure 3:
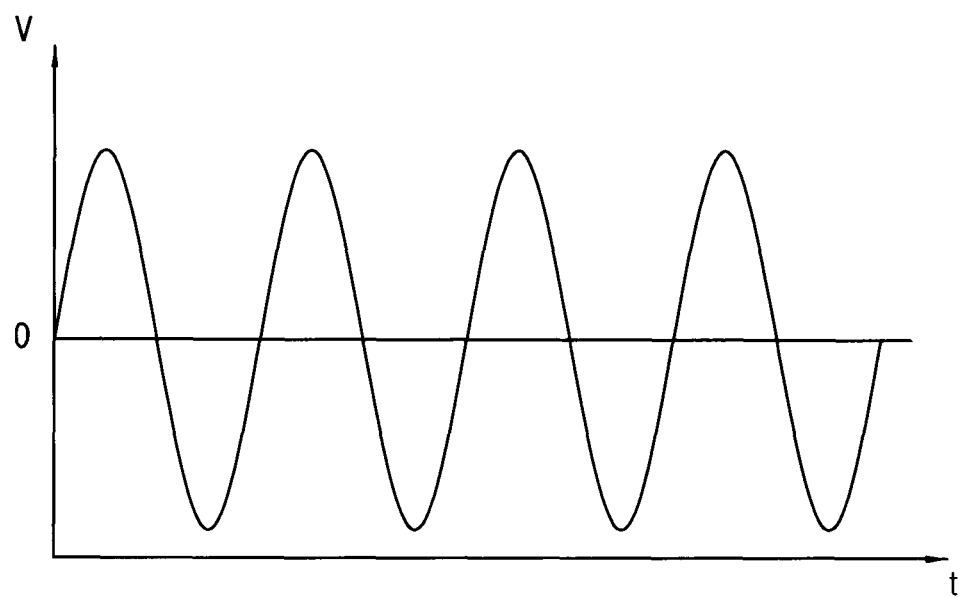
Figure 4:
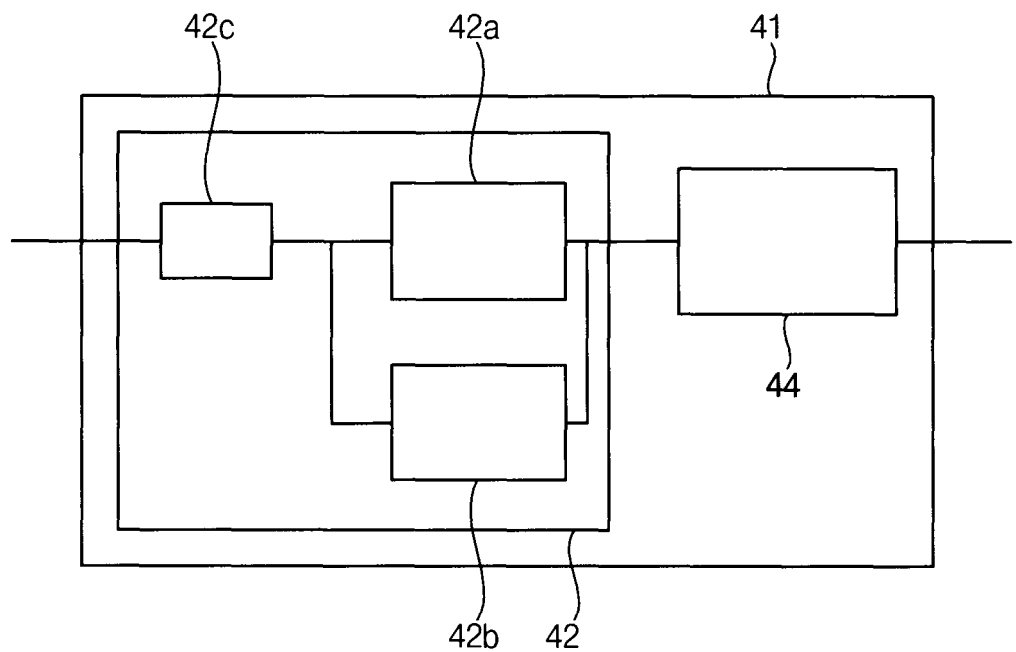
Figure 5:
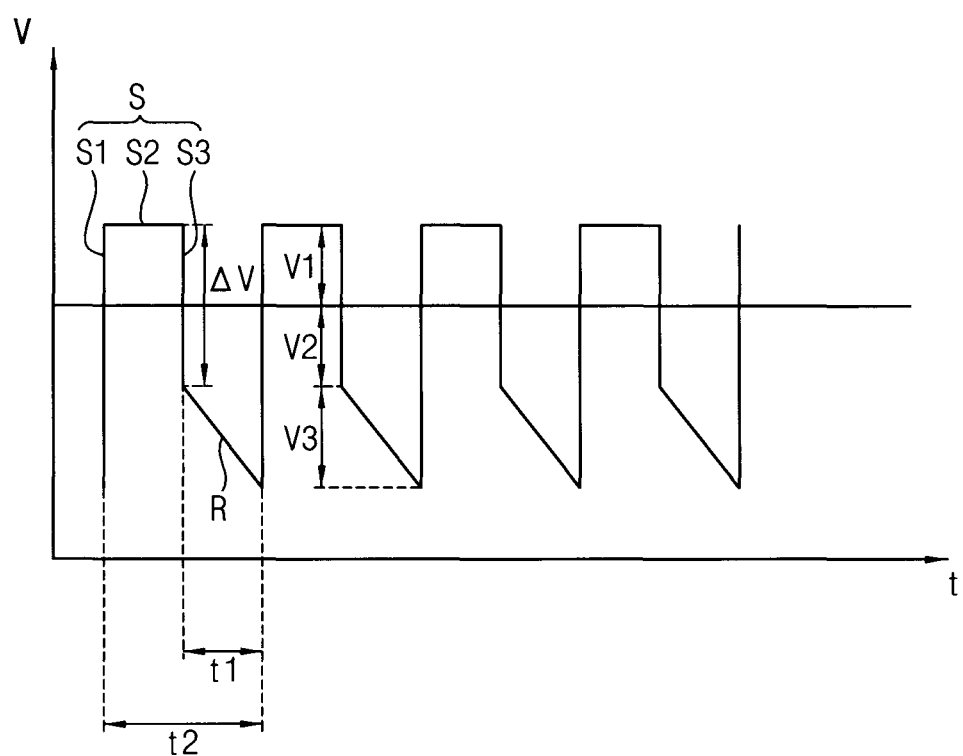

FIG. 1 is a block diagram illustrating a plasma processing apparatus in accordance with example embodiments. FIG. 2 is a view illustrating plasma generated within a chamber of the plasma processing apparatus in FIG. 1. FIG. 3 is a waveform diagram illustrating a sinusoidal wave power signal generated by a plasma power supply of the plasma processing apparatus in FIG. 1. FIG. 4 is a block diagram illustrating a bias power supply of the plasma processing apparatus in FIG. 1. FIG. 5 is a waveform diagram illustrating a nonsinusoidal wave power signal generated by the bias power supply of the plasma processing apparatus in FIG. 1.

Referring to FIGS. 1 to 5, a plasma processing apparatus 10 may include a chamber 20, a substrate stage, an upper electrode 50, a plasma power supply 51, a bias power supply 41 and a controller 80. The plasma processing apparatus 10 may further include a gas supply unit, a gas exhaust unit 26, etc. The substrate stage may include a lower electrode 40, an electrostatic chuck 30 and/or a heater 32.

In example embodiments, the plasma processing apparatus 10 may be an apparatus configured to etch a layer on a substrate such as a semiconductor wafer W disposed within the inductively coupled plasma (ICP) chamber 20. However, the plasma generated by the plasma processing apparatus may not be limited to the inductively coupled plasma, and, for example, capacitively coupled plasma (CCP), microwave plasma, etc., may be generated by the plasma processing apparatus. For example, the plasma processing apparatus 10 may include one of an ICP chamber, a CCP chamber and a microwave plasma chamber, which include different components from each other. The plasma processing apparatus may not be limited to the etching apparatus, and for example, the plasma process apparatus may be a deposition apparatus, a cleaning apparatus, etc. Here, the substrate may include a semiconductor substrate, a glass substrate, etc.

The chamber 20 may provide a sealed space where a plasma etch process is performed on the wafer W. The chamber 20 may be a cylindrical vacuum chamber. The chamber 20 may include a metal such as aluminum, stainless steel, etc.

The substrate stage may be arranged within the chamber 20 to support the substrate. For example, the substrate stage may serve as a susceptor for supporting the wafer W thereon. The substrate stage may include an electrostatic chuck 30 for holding the wafer W using electrostatic force. The wafer W may be adsorptively held on the electrostatic chuck 30 when a direct current is applied thereto by a DC power source 70.

The lower electrode 40 included in the substrate stage may have a circular plate-shape, and lower electrode 40 may be disposed under the electrostatic chuck 30. The lower electrode 40 may be supported by a driving portion 34 such that the lower electrode 40 may move upward and downward. For example, the lower electrode 40 and/or the substrate stage may be moved up and down by the driving portion 34.

The wafer W may be mounted on an upper surface of the electrostatic chuck 30, and a focus ring (not illustrated) may be installed on the substrate stage to surround the wafer W. The lower electrode 40 may have a diameter greater than a diameter of the wafer W. The lower electrode 40 may have a cooling channel (not illustrated) therein. In order to increase a control accuracy of a wafer temperature, a heat transfer gas such as a He gas may be supplied to a gap between the electrostatic chuck 30 and the wafer W.

A gate (not illustrated) for loading/unloading the wafer W may be provided in a sidewall of the chamber 20. The wafer W may be loaded/unloaded onto/from the substrate stage through the gate.

A gas exhaust port 24 may be provided in a bottom portion of the chamber 20. The gas exhaust unit 26 may be connected to the gas exhaust port 24 through a gas exhaust line. The gas exhaust unit may include a vacuum pump such as a turbo-molecular pump or the like, to control a pressure of the chamber 20 so that the processing space in the chamber 20 may be depressurized to a desired/proper/predetermined vacuum level. Additionally, process by-products and residual process gases may be discharged through the exhaust port 24.

The chamber 20 may include a cover 22 covering an upper portion of the chamber 20. The cover 22 may airtightly seal the upper portion of the chamber 20. The upper electrode 50 may be disposed outside the chamber 20 such that the upper electrode 50 faces/opposes the lower electrode 40. The upper electrode 50 may be disposed on the cover 22. The upper electrode 50 may include a radio frequency antenna. The radio frequency antenna may have a plan coil shape. For example, the radio frequency antenna may have a spiral shape emanating from a center of an upper surface of the cover 22 and moving farther away as it revolves around the center of the upper surface of the cover 22. The cover 22 may include a circular plate dielectric window. The dielectric window may include a dielectric material. For example, the dielectric window may include alumina ($Al_2O_3$). An electromagnetic signal generated from the plasma power supply 51 may be transferred from the antenna into the chamber 20 through the dielectric window.

For example, the upper electrode 50 may include an inner coil 50a and an outer coil 50b. The inner coil 50a and the outer coil 50b may have a spiral shape or a concentric shape. The inner coil 50a and the outer coil 50b may generate inductively coupled plasma in a plasma space P of the chamber 20. Herein, two coils 50a and 50b may be described exemplarily, however, it may be understood that the number, arrangement, etc. of the coils may not be limited thereto.

In example embodiments, the gas supply unit may include gas supply lines 60a, 60b, a flow controller 62 and a gas source 64, such as a gas reservoir. For example, the gas supply unit may refer to a set of gas suppling elements. The gas supply lines 60a, 60b may be connected to an upper portion and/or a side portion of the chamber 20 to supply gases into the chamber 20 therethrough. For example, the gas supply lines may include a vertical gas supply line 60a which is connected to the chamber 20 through the cover 22 and a horizontal gas supply line 60b connected to the chamber 20 through the sidewall of the chamber 20. Various gases may be supplied into the plasma space P of the chamber 20 through the vertical gas supply line 60a and the horizontal gas supply line 60b.

The gas supply unit may supply different gases having a desired/predetermined mixture ratio. The gas source 64 may store the gases, and the gases may be supplied through a plurality of gas lines connected to the gas supply lines 60a, 60b respectively. The flow controller 62 may control amounts of the gases supplied into the chamber 20 through the gas supply lines 60a, 60b. The flow controller 62 may control independently or commonly the supply amounts of the gases supplied to the vertical gas supply line 60a and the horizontal gas supply line 60b respectively. For example, the gas source 64 may include a plurality of gas tanks, and the flow controller 62 may include a plurality of mass flow controllers (MFCs) corresponding to the gas tanks, e.g., respectively connected to the gas tanks. The mass flow controllers may control independently the supply amounts of the gases respectively.

The gas supply unit may supply different process gases into the chamber 20. The process gases may include inert gases.

In example embodiments, the plasma power supply 51 may apply a plasma source power to the upper electrode 50. The plasma power supply 51 may apply a sinusoidal wave power to the upper electrode 50 to form plasma within the chamber 20. The bias power supply 41 may apply a bias source power to the lower electrode 40. The bias power supply 41 may apply a nonsinusoidal wave power to the lower electrode 40.

The controller 80 may be connected to the plasma power supply 51 and the bias power supply 41 and may control operations thereof. The controller 80 may include a microcomputer and various interface circuits and may control an operation of the plasma processing apparatus based on programs and recipe information stored in an external or internal memory.

For example, the controller 80 may be a computer (or several interconnected computers) command include, for example, one or more processors configured by software, such as a CPU (Central Processing Unit), controller, etc., forming various functional modules of the computer. The computer may be a general purpose computer or may be dedicated hardware or firmware (e.g., an electronic or optical circuit, such as application-specific hardware, such as, for example, a digital signal processor (DSP) or a field-programmable gate array (FPGA)). A computer may be configured from several interconnected computers. Each functional module (or unit) described herein may comprise a separate computer, or some or all of the functional module (or unit) may be comprised of and share the hardware of the same computer. Connections and interactions between the units described herein may be hardwired and/or in the form of data (e.g., as data stored in and retrieved from memory of the computer, such as a register, buffer, cache, storage drive, etc., such as part of an application programming interface (API)). As is understood, "software" refers to prescribed rules to operate a computer, such as code or script.

For example, the plasma power supply 51 may include an RF power source 54 and an RF matcher 52 as plasma source elements. The RF power source 54 may generate a radio frequency (RF) signal. The RF matcher 52 may match impedance of the RF signal generated by the RF power source 54 using the coils 50a and 50b to control generation of plasma.

The plasma power supply 51 may apply a radio frequency power signal to the upper electrode 50 in response to the plasma power control signal. For example, the radio frequency power may be generated to have a frequency range of about 13 MHz to about 2.45 GHz and an RF power range of about 100 W to about 1000 W.

As the radio frequency power having a predetermined frequency (for example, 13.56 MHz) is applied to the upper electrode 50, an electromagnetic field induced by the upper electrode 50 may be applied to a source gas supplied within the chamber 20 to generate plasma.

The bias power supply 41 may apply a bias power signal to the lower electrode 40 in response to the bias power control signal. The bias power supply 41 may include various circuits which are configured to generate a pulse signal having a nonsinusoidal voltage waveform and to supply/output compensation current, and may apply a bias power having a desired/predetermined nonsinusoidal voltage waveform to the lower electrode 40.

The voltage waveform of the bias power signal applied by the bias power supply 41 may be controlled such that a desired/predetermined voltage and a predetermined ion energy distribution may be generated in a surface of a wafer W and a desired/predetermined ion flux and a predetermined etch rate may be obtained.

As illustrated in FIG. 4, the bias power supply 41 may include a DC power generator 44 and a modulator 42. The modulator 42 may include a pulse adjusting portion 42a and a ramp adjusting portion 42b. The modulator 42 may further include a filtering portion 42c. Although it is not illustrated in the figures, an output portion of the modulator 42 may be connected to an output (V/I) sensor. A voltage value and a current value of the bias power signal applied to the lower electrode 40 may be detected by the V/I sensor, and the controller 80 may receive the detected values and may monitor and control the bias power signal.

As illustrated in FIG. 5, the power signal applied to the lower electrode 40 may have a nonsinusoidal voltage waveform. The bias power signal outputted from the bias power supply 41 may have a first portion S1, a second portion S2, a third portion S3 and a fourth portion R within one period/cycle of the bias power signal. The first to third portions S1, S2 and S3 may constitute a DC pulse portion S, and the fourth portion R may constitute a ramp portion. For example, the second portion S2 may be a DC signal portion, and the first portion S1 and the third portion S3 may be transient portions. For example, the first portion S1 may be a transient portion rising from the ramp portion R to the DC signal portion S2, and the third portion S3 may be a transient portion falling from the DC signal portion S2 to the ramp portion R. For example, the ramp portion R may be between the DC pulses S. The ramp portion R may be a portion which is modulated by the ramp adjusting portion 42b, and may have a waveform which declines gradually over time while the bias power signal is decreasing from a maximum of the ramp portion R to the minimum of the ramp portion R. For example, the ramp portion R may have a negative slope. For example, the ramp portion R may continuously decrease throughout the ramp portion R with a negative rise.

The modulator 42 may adjust a positive voltage value (V1) of the DC pulse portion S, a negative voltage value (V2) of the DC pulse portion S, a voltage value (V3) of the ramp portion R, a slope (dV/dt) of the ramp portion R, a duration time (t1) (ratio (t1/t2)) of the ramp portion R, an on/off duty ratio of the nonsinusoidal wave, etc., in response to the bias power control signal from the controller 80.

For example, the frequency of the DC pulse portion S may be adjusted within a range of 100 kHz to 400 kHz. The positive voltage value (V1) of the DC pulse portion S may be adjusted within a range of 0V to 600V. The negative voltage value (V2) of the DC pulse portion S may be adjusted within a range of 0V to −700V. The voltage value (V3) of the ramp portion R may be adjusted within a range of −100V to −800V. The time ratio (t1/t2) of the ramp portion R within one period/cycle of the bias power signal, e.g., the duration ratio of the ramp portion R may be adjusted within a range of 20% to 80%. An on/off frequency of the nonsinusoidal wave within a process period/cycle may be adjusted within a range of 10 Hz to 1000 Hz. The on/off duty ratio of the nonsinusoidal wave within the process period/cycle may be adjusted within a range of 5% to 95%.

The slope of the ramp portion R of the nonsinusoidal wave may be adjusted to have a desired/predetermined voltage in the substrate surface, to thereby generate a desired/predetermined ion energy distribution, e.g., on the substrate. The slope of the ramp portion R may be adjusted to generate an ion energy distribution having a narrow single peak. For example, the slope of the ramp portion R may be helpful to achieve a narrow single peak of ion energy distribution, e.g., low deviation of ion energy distribution on the substrate. For example, the ion energy distribution on the substrate may depend on the slope of the ramp portion R of the bias power signal. The low deviation narrow peak ion energy distribution may be helpful for an etching process to achieve uniform patterns on the substrate. The duration time of the ramp portion R may be adjusted to control ion flux to thereby improve an etch depth difference between openings (having different widths) in a cell region, e.g., intra cell (IC) loading. For example, IC loading in this disclosure may refer to non-uniform patterns formed in a cell region of a semiconductor device caused by different etch rates between different pattern widths, or IC loading may be a phenomenon that etch rate depends on pattern widths. The on/off duty ratio of the nonsinusoidal wave within the process period/cycle may be adjusted to improve the IC loading and UPEH (Unit Per Equipment Hour). Thus, a controllability of an etch profile for forming a hole having a high aspect ratio may be improved.

Although it is not illustrated in the figures, the bias power supply 41 may further include a sinusoidal power source configured to apply a sinusoidal power to the lower electrode 40. Additionally, the bias power supply 41 may further include a switching portion configured to select and apply the sinusoidal power from the sinusoidal power source and the nonsinusoidal power to the lower electrode 40 simultaneously or selectively. The switching portion may be installed between the sinusoidal power source and the lower electrode 40 to apply selectively the sinusoidal power or the nonsinusoidal power. For example, when the sinusoidal power and the nonsinusoidal power are simultaneously applied to the lower electrode 40, the power applied to the lower electrode 40 may have a composite waveform of the sinusoidal power and the nonsinusoidal power.

In example embodiments, the plasma processing apparatus 10 may include a temperature control device within the substrate stage. The temperature control device may include a heater and/or a cooler. For example, the temperature control device may include a heater 32 within the electrostatic chuck 30 to control a temperature of the electrostatic chuck 30, a heater power supply 70 configured to supply a power to the heater 32, and a filter 72 disposed between the heater 32 and the heater power supply 70.

Hereinafter, a method of processing a substrate using the plasma processing apparatus in FIG. 1 will be explained.

Figure 6:
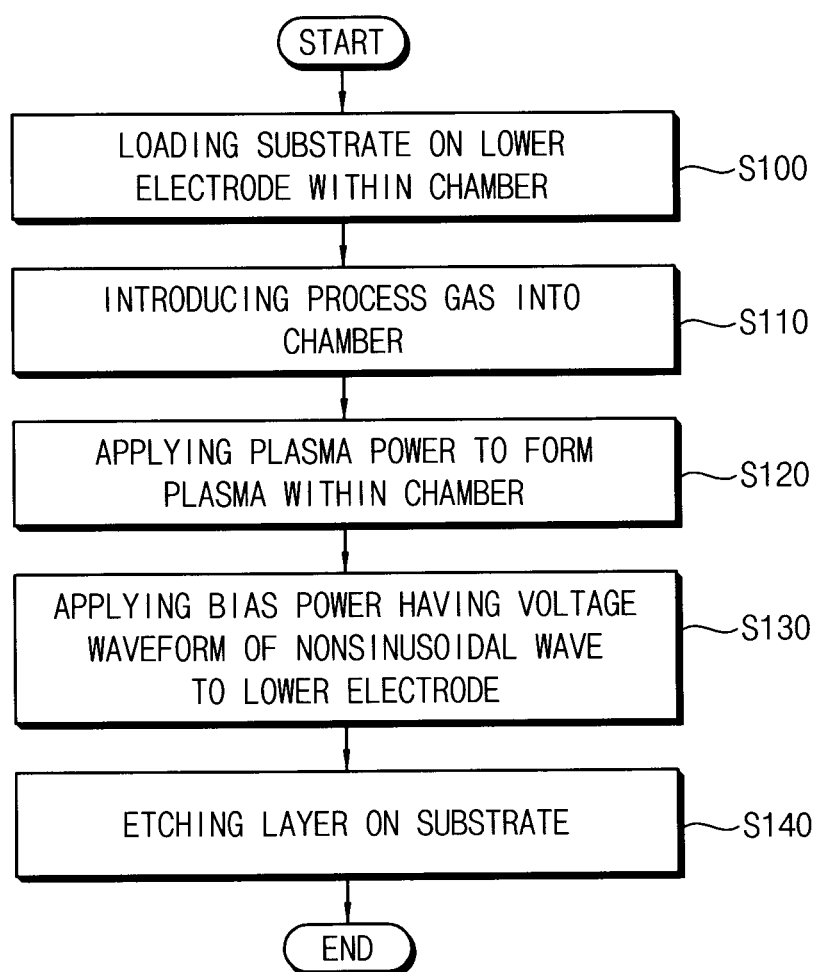

FIG. 6 is a flow chart illustrating a plasma processing method in accordance with example embodiments.

Referring to FIGS. 1 and 6, after a substrate is loaded into an inductively coupled plasma chamber 20 (S100), a process gas may be supplied onto the substrate within the chamber 20 (S110).

For example, a semiconductor wafer W may be loaded on an electrostatic chuck 30 of a substrate stage within the chamber 20. The process gas (for example, an etching process gas) may be introduced into the chamber 20 through gas supply lines 60a, 60b and then a pressure of the chamber 20 may be controlled to a desired/predetermined vacuum level by a gas exhaust unit 26.

Then, a plasma power may be applied to an upper electrode 50 to generate plasma within the chamber 20 (S120), a bias power may be applied to a lower electrode 40 to perform an etch process on an object layer on the substrate (S130).

A plasma power supply 51 may apply a radio frequency power signal to the upper electrode 50 in response to a plasma power control signal from a controller 80. For example, as the radio frequency power having a predetermined frequency (for example, 13.56 MHz) is applied to the upper electrode 50, an electromagnetic field induced by the upper electrode 50 may be applied to a source gas within the chamber 20 to generate plasma.

A bias power supply 41 may apply a bias power signal, e.g., having a nonsinusoidal voltage waveform to the lower electrode 40 in response to a bias power control signal from the controller 80. In certain embodiments, the bias power supply 41 may apply a bias power signal having a sinusoidal voltage waveform together with or instead of the bias power signal having the nonsinusoidal voltage waveform.

As the bias power having the nonsinusoidal voltage waveform is applied to the lower electrode 40, an ion energy distribution having a relatively narrow single peak may be generated in a surface of the wafer W. Thus, a controllability of an etch profile for forming a hole having a high aspect ratio may be improved. For example, the narrow single peak ion energy distribution may be beneficial to achieve a uniform etch rate throughout the surface of the wafer W.

Hereinafter, the bias power applying step of the plasma processing method in FIG. 6 will be explained.

Figure 7:
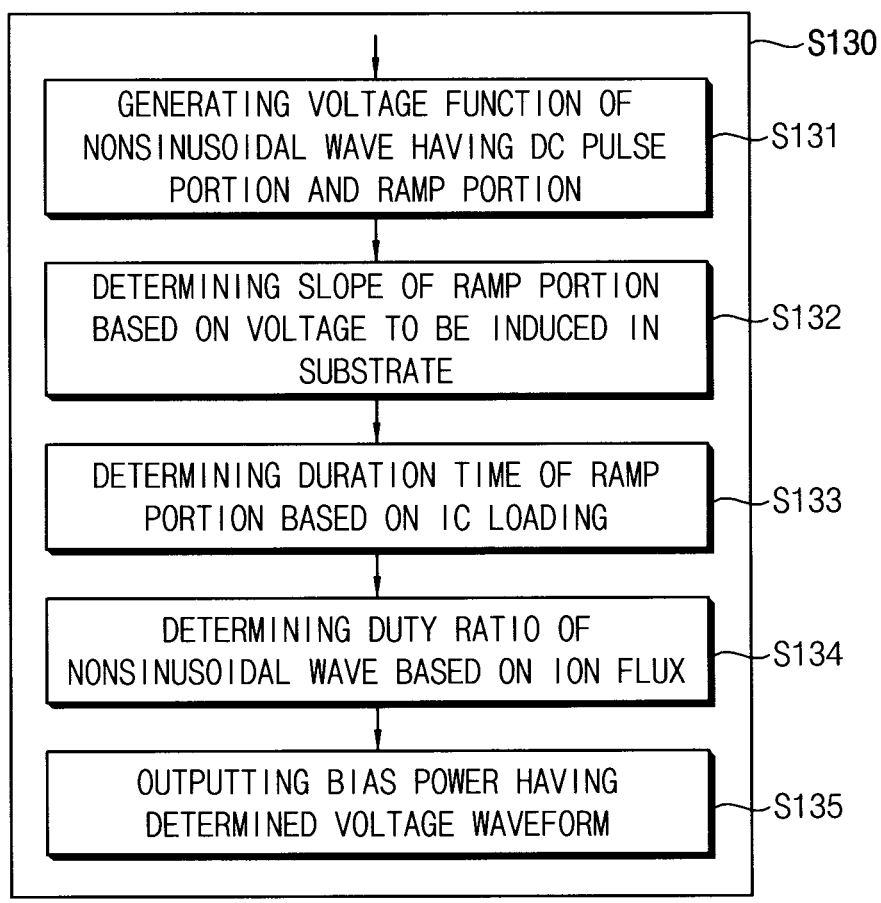
Figure 8A:
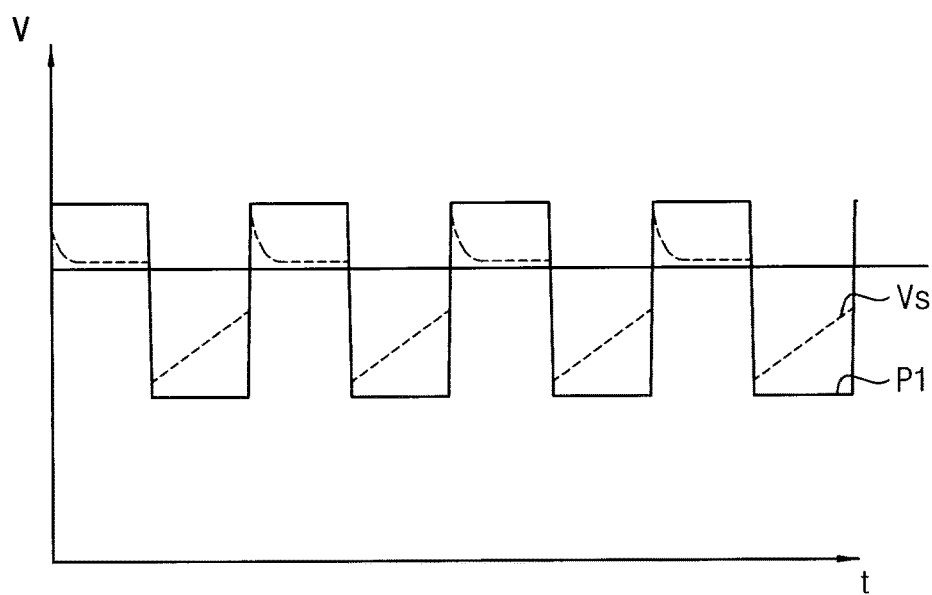
FIGS. 8A to 8D are graphs illustrating a voltage induced in a substrate according to a slope of a ramp portion of the nonsinusoidal voltage waveform.
Figure 8B:
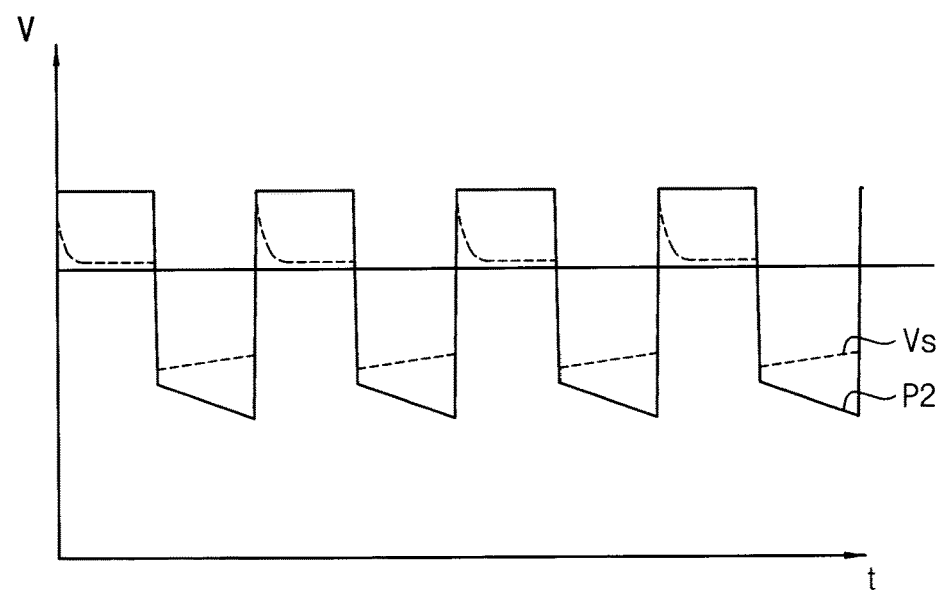
Figure 8C:
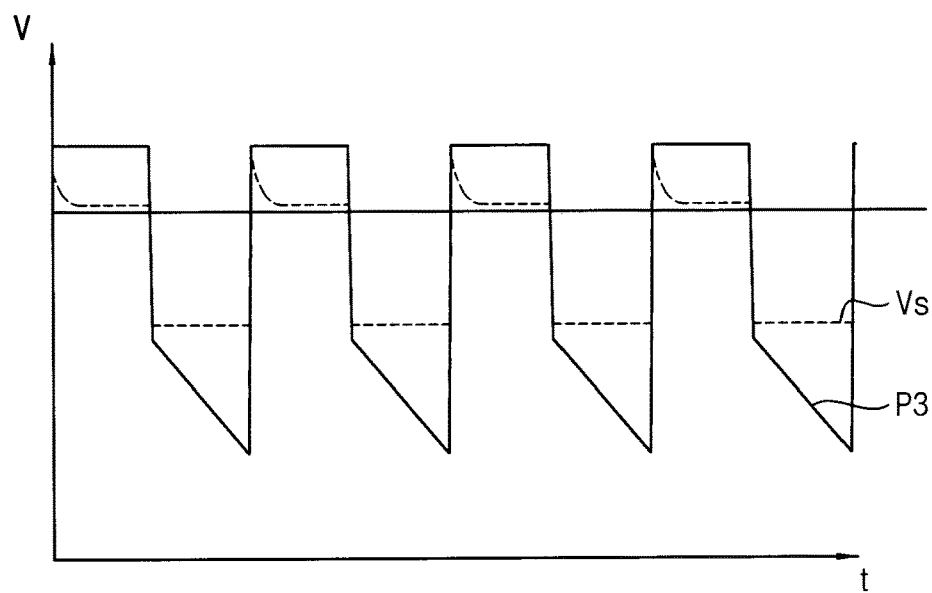
Figure 8D:
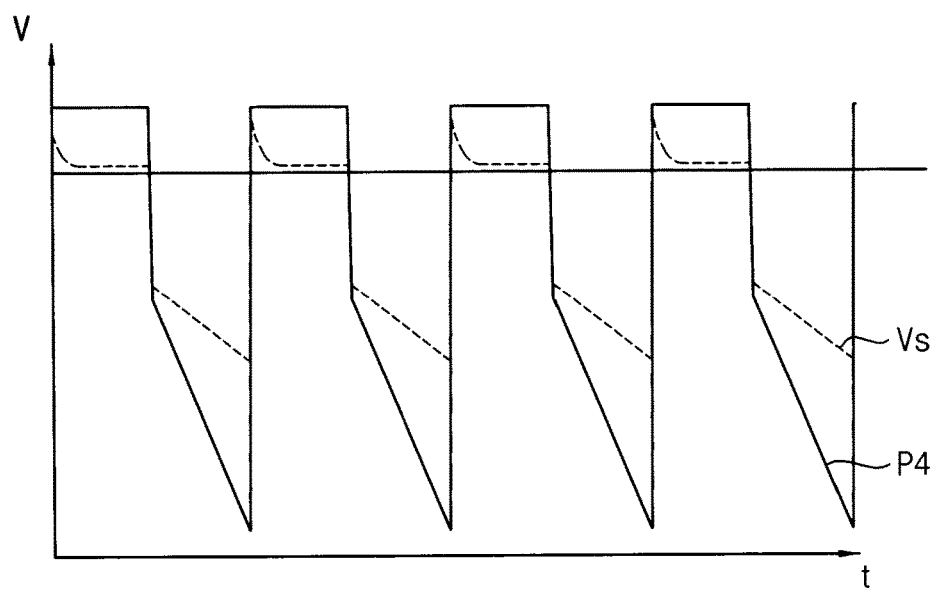
Figure 9:
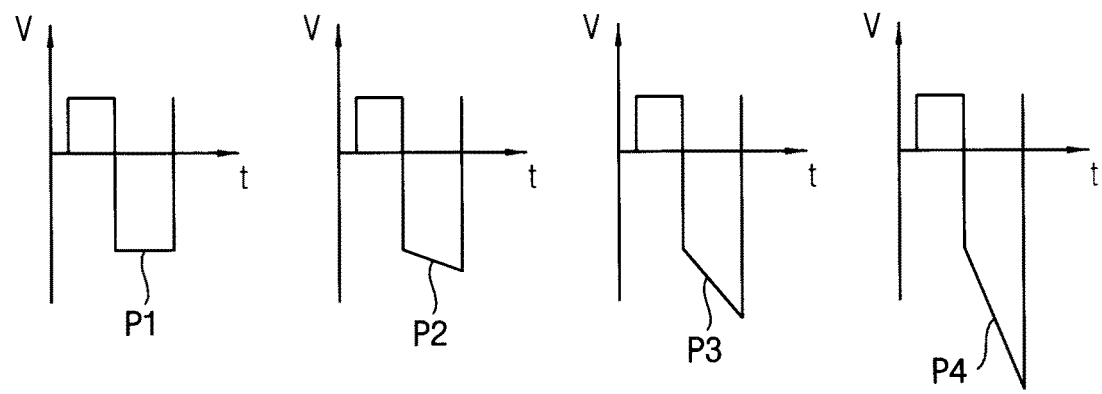
Figure 9:
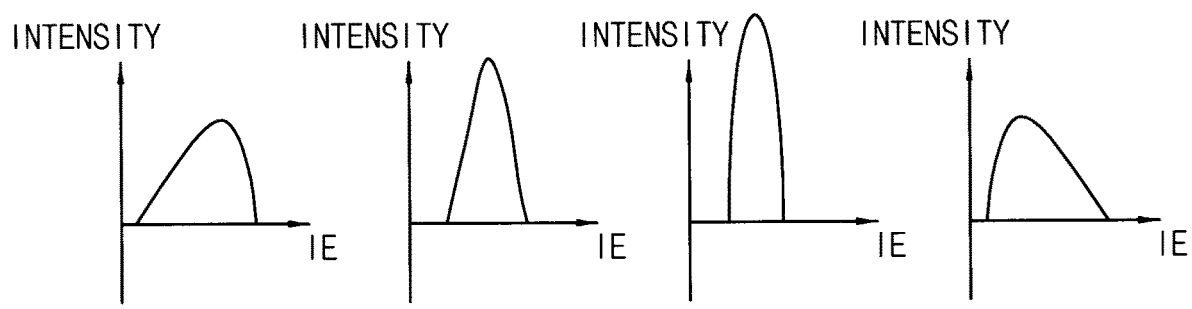
Figure 10:
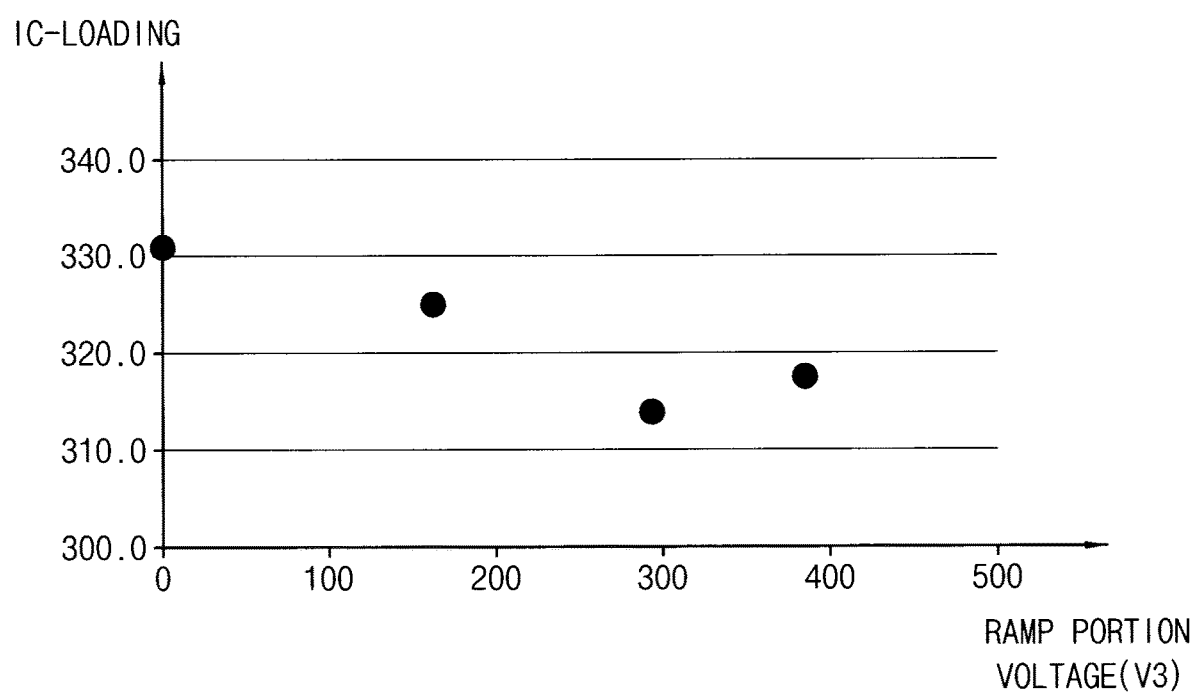
Figure 11:
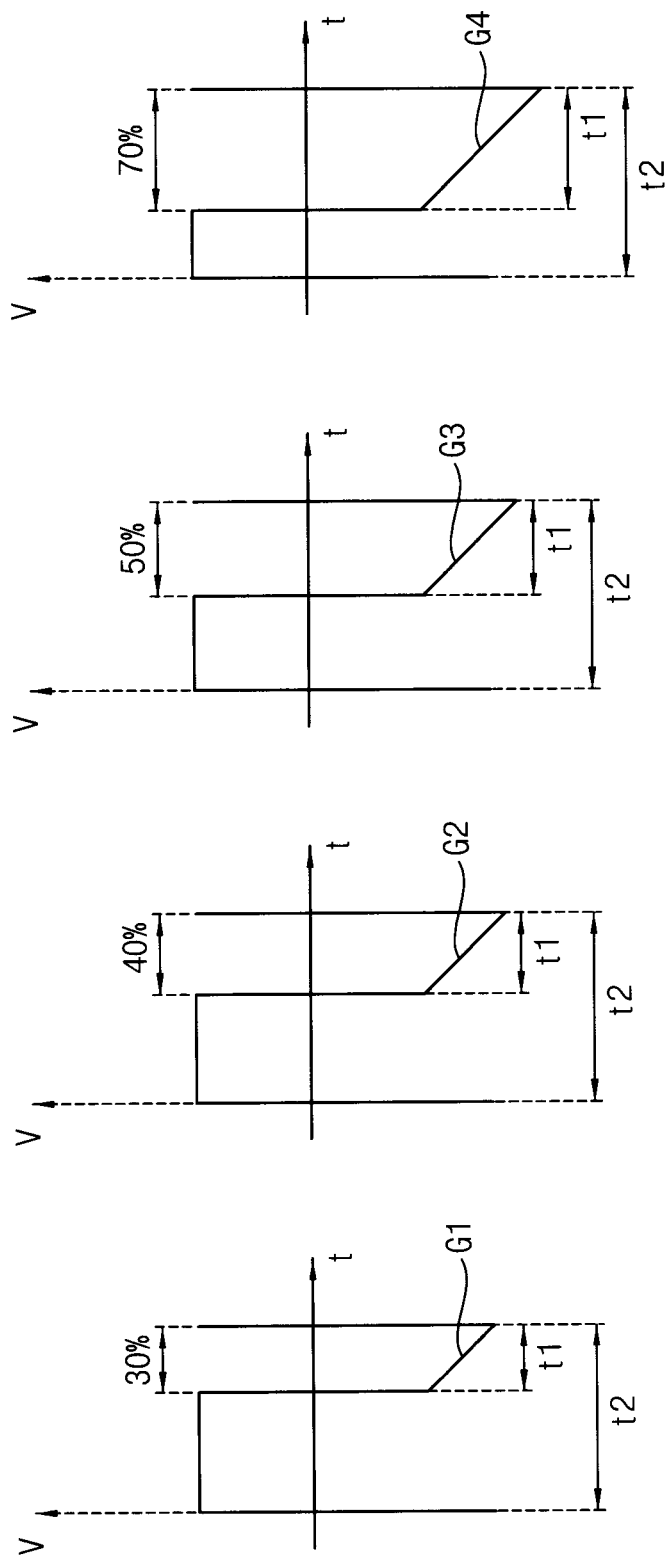
Figure 12:
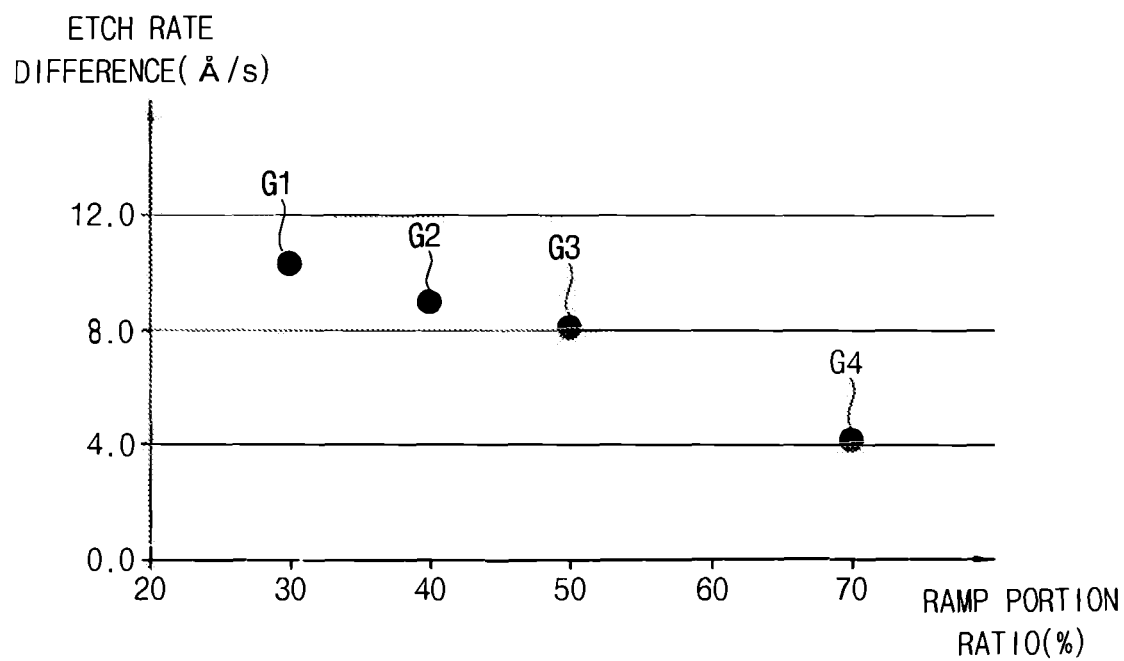
Figure 13:
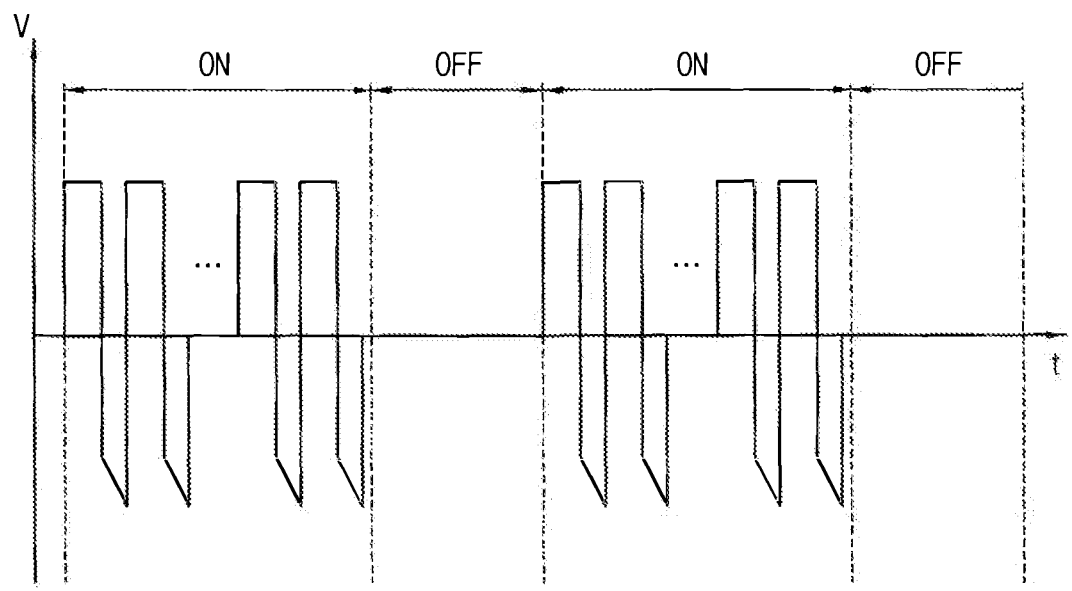

FIG. 7 is a flow chart illustrating a step of applying a bias power having a nonsinusoidal voltage waveform in accordance with example embodiments. FIGS. 8A to 8D are graphs illustrating a voltage induced in a substrate according to a slope of a ramp portion of the nonsinusoidal voltage waveform. FIG. 9 shows graphs illustrating an ion energy distribution according to the slope of the ramp portion. FIG. 10 is a graph illustrating IC loading according to a voltage value of the ramp portion. FIG. 11 shows graphs illustrating a duration ratio of the ramp portion in accordance with example embodiments. FIG. 12 is a graph illustrating an etch rate difference (IC loading) according to the duration ratio of the ramp portion in FIG. 11. FIG. 13 is a graph illustrating an on/off duty ratio of the nonsinusoidal voltage waveform.

Referring to FIGS. 1, 4, 5 and 7, first, a voltage function (e.g., a waveform) of nonsinusoidal wave having a DC pulse portion S and a ramp portion R may be generated (S131).

A bias power supply 41 may generate and mix/combine/composite switching (DC) signals to output the voltage function of nonsinusoidal wave having the DC pulse portion S and the ramp portion R. The ramp portion R may be a portion which is modulated by a ramp adjusting portion 42b, and may have a waveform which declines gradually over time while decreasing from the maximum of the ramp portion R to the minimum of the ramp portion R. For example, the ramp portion R may have a negative slope, e.g., throughout the ramp portion R.

Then, the outputted voltage function of nonsinusoidal wave may be monitored by an output (V/I) sensing portion of a modulator 42, and the voltage function of nonsinusoidal wave may be adjusted based on process conditions within a plasma chamber 20.

Frequencies of the voltage function of nonsinusoidal wave, a positive voltage value (V1) of the DC pulse portion S, a negative voltage value (V2) of the DC pulse portion S and a voltage value (V3) of the ramp portion R may be adjusted using a pulse adjusting portion 42a and the ramp adjusting portion 42b of the modulator 42.

For example, the frequency of the DC pulse portion S may be adjusted within a range of 100 kHz to 400 kHz. The positive voltage value (V1) of the DC pulse portion S may be adjusted within a range of 0V to 600V. The negative voltage value (V2) of the DC pulse portion S may be adjusted within a range of 0V to −700V. The voltage value (V3) of the ramp portion R may be adjusted within a range of −100V to −800V.

In example embodiments, the slope of the ramp portion R may be determined based on a voltage to be induced in a substrate (S132).

As illustrated in FIGS. 8A to 8D, the voltage Vs induced in a surface of a wafer W may be controlled by the negative slope of the ramp portion R. The slope of the ramp portion R (graph P3) may be selected such that the voltage Vs induced in the surface of the wafer W has a desired/predetermined constant value. The slope of the voltage ramp portion R may be adjusted to thereby prevent the wafer surface from being charged positively with positive ions. For example, the slope of the voltage ramp portion R may be adjusted to compensate a positive ion accumulation on the wafer surface.

As illustrated in FIG. 9, an ion energy distribution on the wafer W may be controlled by the negative slope of the ramp portion R. The slope of the ramp portion R (graph P3) may be selected such that the ion energy distribution having a narrow single peak. The slope of the ramp portion R may be adjusted to thereby control the ion energy distribution in the surface of the wafer W.

As illustrated in FIG. 10, an etch depth difference between openings having different sizes (widths) in a cell region, e.g., IC (intra cell) loading may be improved by the voltage value (V3) of the ramp portion R. After the slope of the ramp portion R is determined, the voltage value (V3) of the ramp portion R capable of minimizing the IC loading may be selected. While the slope of the ramp portion R is maintained at the determined value, the voltage value V3 of the ramp portion R may be adjusted to thereby improve the IC loading.

Then, a duration ratio of the ramp portion R may be determined based on the IC loading.

As illustrated in FIG. 11, a time ratio (t1/t2) of the ramp portion R to a cycle of the voltage function within one period/cycle of the voltage function of nonsinusoidal wave, e.g., the duration ratio of the ramp portion R to a cycle of non-sinusoidal wave may be adjusted. The duration ratio of the ramp portion R to the corresponding period/cycle may be adjusted within a range of 20% to 80%. While the slope of the ramp portion R is maintained at the determined value, the duration ratio of the ramp portion R may be adjusted. For example, when one period (t2) is 2.5 μs, graph G1 may represent a case where the duration ratio of the ramp portion R is adjusted 30% (duration time (t1) of the ramp portion R is 0.75 μs), graph G2 may represent a case where the duration ratio of the ramp portion R is adjusted 40% (duration time (t1) of the ramp portion R is 1.0 μs), graph G3 may represent a case where the duration ratio of the ramp portion R is adjusted 50% (duration time (t1) of the ramp portion R is 1.25 μs), and graph G4 may represent a case where the duration ratio of the ramp portion R is adjusted 70% (duration time (t1) of the ramp portion R is 1.75 μs).

As illustrated in FIG. 12, an etch rate difference between openings having different sizes in a cell region, e.g., IC loading, may be controlled according to the duration ratio of the ramp portion R. The duration ratio of the ramp portion R (70%, graph G4) capable of minimizing the IC loading may be selected. The duration ratio of the ramp portion R may be adjusted to thereby improve the IC loading.

Then, an on/off duty ratio of the nonsinusoidal wave may be determined based on an ion flux (S134).

As illustrated in FIG. 13, the on/off duty ratio of the nonsinusoidal wave within a process period/cycle may be adjusted within a range of 5% to 95%. For example, the on/off duty ratio of the nonsinusoidal wave may be adjusted within a range of 50% to 80%. The on/off duty ratio of the nonsinusoidal wave may be adjusted to thereby remove efficiently a gas and process by-products within a pattern (opening) formed during an etch process.

As mentioned above, the slope of the ramp portion R of nonsinusoidal wave may be adjusted to have a desired/proper/predetermined voltage in a substrate surface to thereby generate a desired/proper/predetermined ion energy distribution in the substrate surface. The slope of the ramp portion R may be adjusted to generate the ion energy distribution having a narrow single peak. The duration time of the ramp portion R may be adjusted to control an ion flux to thereby improve an etch depth difference between openings having different sizes in a cell region, e.g., IC loading. The on/off duty ratio of the nonsinusoidal wave within the process period/cycle may be adjusted to thereby improve the IC loading. Thus, a controllability of an etch profile for forming a hole having a high aspect ratio may be improved.

Hereinafter, a method of forming a pattern of a semiconductor device using the plasma processing method in FIGS. 6 and 7 will be explained.

Figure 14:
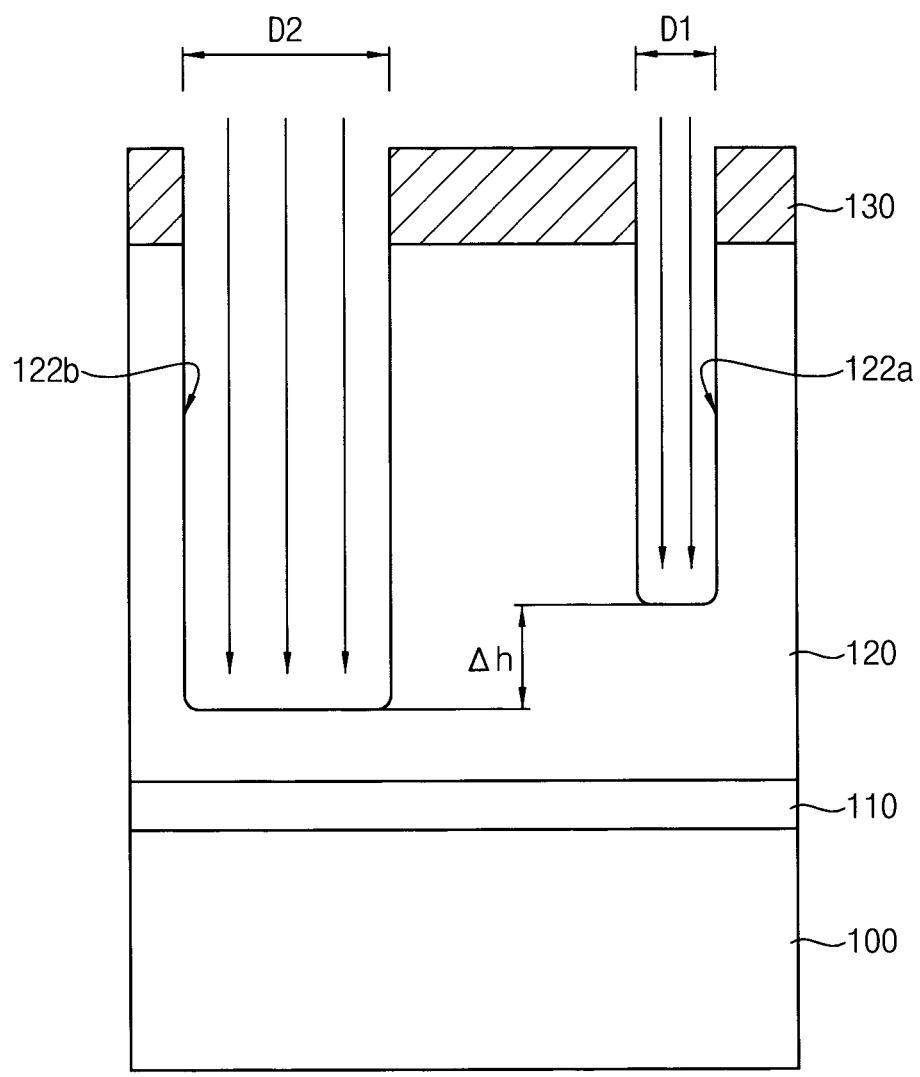

FIG. 14 is a cross-sectional view illustrating a method of forming a pattern of a semiconductor device in accordance with example embodiments.

Referring to FIG. 14, after a thin layer 110 and an object layer 120 are formed sequentially on a semiconductor substrate 100, a photoresist pattern 130 may be formed on the object layer 120 and an etch process may be performed on the object layer 120 using the photoresist pattern 130 as an etching mask.

The object layer 120 may include a metal layer, a metal nitride layer, an insulation layer, a semiconductor layer, etc. In certain embodiments, the thin layer 110 and the object layer 120 may be omitted, and the semiconductor substrate 100 may be the object layer to be etched.

For example, the substrate 100 having the photoresist pattern 130 formed thereon may be loaded into a chamber 20 of a plasma processing apparatus 10 in FIG. 1, a process gas may be supplied onto/above the substrate 100. The process gas (for example, an etching gas) may be introduced into the chamber 20 through gas supply lines 60a, 60b and then a pressure of the chamber 20 may be controlled to a desired/predetermined vacuum level by a gas exhaust unit 26.

Then, a plasma power may be applied to an upper electrode 50 to generate plasma within the chamber 20, and a bias power may be applied to a lower electrode 40 to perform the etch process.

A sinusoidal wave power may be applied to the upper electrode 50 to form plasma within the chamber 20, and a nonsinusoidal wave power may be applied to the lower electrode 40.

In example embodiments, the photoresist pattern 130 may include a plurality of openings. For example, the openings may have different diameters/widths/lengths. The etch process may be performed to form a first opening 122a having a first diameter/width D1 and a second opening 122b having a second diameter/width D2. For example, the first and second openings 122a and 122b may have an aspect ratio of at least 14. The first and second openings 122a and 122b may be trenches which are used for forming an isolation layer pattern in the semiconductor substrate. For example, an isolation pattern may be formed in the first and second openings 122a and 122b.

When the first and second openings 122a and 122b have different sizes and are formed in a cell region together by the etch process, an etch depth difference (Δh) between the first and second openings 122a and 122b, e.g., IC loading may occur. A voltage function of the nonsinusoidal wave may be adjusted to reduce the IC loading.

The voltage function (e.g., waveform) of the nonsinusoidal wave applied to the lower electrode 40 may be adjusted to improve the IC loading and UPEH (Unit Per Equipment Hour). For example, a proper waveform of the bias voltage may improve uniformity of etch rate and thereby improve throughput of the etching process. For example, a negative slope of a ramp portion R of the voltage function of the nonsinusoidal wave and a duration ratio of the ramp portion R to a cycle of the waveform (e.g., graph G4) capable of minimizing the IC loading may be selected. The slope and the duration ratio of the ramp portion R may be adjusted, to thereby improve the IC loading.

Hereinafter, a method of manufacturing a semiconductor device according to an embodiment of the present disclosure will be described.

According to the method of manufacturing a semiconductor device, a plasma processing apparatus 10 including a plasma chamber 20 may be set to provide an RF power to an upper elegy rode 50 and to provide a bias power to a lower electrode 40 using one of the embodiments described above. And then, a substrate may be provided into the chamber 20 on the lever electrode 40 (e.g., on an electrostatic chuck disposed on the lower electrode 40). The substrate may be a semiconductor substrate, for example, a crystalline silicon substrate, a crystalline germanium substrate or a crystalline silicon-germanium substrate and be in the form of a water W. An etching process may be performed on the substrate to form a pattern. The pattern may be a semiconductor pattern, an insulator pattern or a conductor pattern. Various semiconductor patterns and various conductor patterns may be additionally formed on the substrate before and/or after performing the etching process to form circuits including transistors, capacitors and/or switches via a plurality of manufacturing processes including multiple steps of photolithography processes. For example, when the substrate is provided to the chamber, the substrate may be a bare semiconductor substrate, or one or more layers of patterns and/or thin films may be formed on the substrate before the substrate is supplied into the plasma processing chamber 20 and has a thin film formed thereon. The thin film formed on the substrate may be patterned by an etching process performed in the plasma processing chamber 20 to form a portion of a circuit and/or insulation patterns as part of an integrated circuit of the semiconductor device being formed. For example, the pattern of the thin film formed in the plasma processing chamber 20 may be a conductor film or an insulator film. After forming various circuits on the substrate, the resulting wafer including the substrate may be diced and packaged to form a semiconductor device.

A semiconductor device manufactured by a plasma processing apparatus and a plasma processing method in accordance with example embodiments may be used in various systems such as a computing system. The semiconductor device may include finFET, DRAM, V-NAND, etc. The systems may include illumination devices. A system including the semiconductor device may be applied to a computer, a portable computer, a laptop computer, a personal portable terminal, a tablet, a cell phone, a digital music player, etc.

The foregoing is illustrative example embodiments and is not to be construed as limiting thereof. Although a few example embodiments have been described, those skilled in the art will readily appreciate that many modifications are possible in example embodiments without materially departing from the novel teachings and advantages of the disclosure. Accordingly, all such modifications are intended to be included within the scope of example embodiments as defined in the claims.

What is claimed is:

1. A plasma processing apparatus, comprising:
   a chamber;
   a substrate stage configured to support a substrate within the chamber, the substrate stage including a lower electrode;
   an upper electrode disposed over the lower electrode to face the substrate;
   a plasma power supply configured to supply a plasma power to the upper electrode to form plasma within the chamber;
   a bias power supply configured to apply a bias power of a nonsinusoidal wave having a DC pulse portion and a ramp portion to the lower electrode in response to a bias control signal; and
   a controller configured to control a slope of the ramp portion and a duration ratio of the ramp portion to a cycle of the nonsinusoidal wave by adjusting the duration ratio while maintaining the slope of the ramp portion, such that an ion energy distribution is generated at a surface of the substrate, and to output the bias control signal to the bias power supply corresponding to the bias power of the nonsinusoidal wave.

2. The plasma processing apparatus of claim 1, wherein the bias power supply comprises a DC power generator configured to generate a voltage function of the nonsinusoidal wave having the DC pulse portion and the ramp portion.

3. The plasma processing apparatus of claim 1, wherein the bias power supply comprises a modulator configured to adjust the DC pulse portion and the ramp portion.

4. The plasma processing apparatus of claim 3, wherein the modulator is configured to adjust the slope of the ramp portion such that a voltage induced in the surface of the substrate has a constant value.

5. The plasma processing apparatus of claim 3, wherein the modulator is configured to adjust the duration ratio of the ramp portion to a cycle of the bias power to a value that reduces an etch rate difference between openings having different sizes to be formed on the substrate.

6. The plasma processing apparatus of claim 5, wherein the modulator is configured so that the duration ratio of the ramp portion to the cycle of the bias power is adjusted to be within a range of 20% to 80% within one period.

7. The plasma processing apparatus of claim 3, wherein the modulator is configured to adjust an on/off duty ratio of the nonsinusoidal wave based on an ion flux moving toward the substrate.

8. The plasma processing apparatus of claim 7, wherein the modulator is configured so that the on/off duty ratio of the nonsinusoidal wave is adjusted to be within a range greater than 5% and less than 95% of a process period.

9. The plasma processing apparatus of claim 3, wherein the modulator further comprises a sensing portion configured to detect a voltage value and a current value of the bias power applied to the lower electrode.

10. The plasma processing apparatus of claim 9, wherein the controller receives the detected values from the sensing portion to monitor the bias power applied to the lower electrode.

11. A plasma processing apparatus, comprising:
a chamber;
a substrate stage configured to support a substrate within the chamber, the substrate stage including a lower electrode;
an upper electrode disposed over the lower electrode to face the substrate;
a plasma power supply configured to supply a plasma power to the upper electrode to form plasma within the chamber;
a bias power supply configured to apply a bias power of a nonsinusoidal wave having a DC pulse portion and a ramp portion to the lower electrode in response to a bias control signal, the bias power supply including a DC power generator configured to generate a voltage function of the nonsinusoidal wave and a modulator configured to set a slope of the ramp portion and set a duration ratio of the ramp portion to a cycle of the voltage function; and
a controller configured to adjust the slope of the ramp portion and the duration ratio of the ramp portion in order to control an ion energy distribution generated at a surface of the substrate and to output the bias control signal to the bias power supply corresponding to the bias power of the nonsinusoidal wave,
wherein the modulator is configured to adjust the duration ratio of the ramp portion to the cycle of the voltage function to an amount that reduces an etch rate difference between openings having different sizes to be formed on the substrate.

12. The plasma processing apparatus of claim 11, wherein the modulator is configured to adjust the slope of the ramp portion based on a voltage induced in the surface of the substrate in order to control the ion energy distribution to have a desired narrow single peak.

13. The plasma processing apparatus of claim 11, wherein the modulator is configured to set the slope of the ramp portion such that a voltage having a constant value is induced in the substrate while the ramp portion of the bias power is applied to the lower electrode.

14. The plasma processing apparatus of claim 11, further comprising a gas supply configured to supply different gases having a predetermined mixture ratio.

15. The plasma processing apparatus of claim 11, wherein the modulator is configured to adjust the duration ratio of the ramp portion while maintaining the slope of the ramp portion.

16. The plasma processing apparatus of claim 15, wherein the modulator is configured so that the duration ratio of the ramp portion to the cycle of the bias power is adjusted to be within a range of 20% to 80% within one period.

17. The plasma processing apparatus of claim 11, wherein the modulator is configured to adjust an on/off duty ratio of the nonsinusoidal wave based on an ion flux moving toward the substrate.

18. The plasma processing apparatus of claim 17, wherein the modulator is configured so that the on/off duty ratio of the nonsinusoidal wave is set to be within a range greater than 5% and less than 95% of a process period.

19. The plasma processing apparatus of claim 11, wherein the modulator further comprises a sensing portion configured to detect a voltage value and a current value of the bias power applied to the lower electrode.

20. The plasma processing apparatus of claim 19, wherein the controller receives the detected values from the sensing portion to monitor the bias power applied to the lower electrode.

* * * * *